(12) United States Patent
Wang et al.

(10) Patent No.: US 12,085,986 B2
(45) Date of Patent: Sep. 10, 2024

(54) DISPLAY PANEL AND MANUFACTURING METHOD THEREFOR, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Zuojia Wang, Beijing (CN); Liqiang Chen, Beijing (CN); Yongchun Jiang, Beijing (CN); Jiafan Shi, Beijing (CN); Qingsong Wang, Beijing (CN); Chao Zhou, Beijing (CN); Xin Lai, Beijing (CN); Yunpeng Zhang, Beijing (CN); Xingjian Xu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 100 days.

(21) Appl. No.: 17/801,526

(22) PCT Filed: Nov. 17, 2021

(86) PCT No.: PCT/CN2021/131310
§ 371 (c)(1),
(2) Date: Aug. 23, 2022

(87) PCT Pub. No.: WO2022/179199
PCT Pub. Date: Sep. 1, 2022

(65) Prior Publication Data
US 2023/0350456 A1    Nov. 2, 2023

(30) Foreign Application Priority Data

Feb. 26, 2021 (CN) .......................... 202110218983.6

(51) Int. Cl.
*G06F 1/16* (2006.01)
*G02F 1/00* (2006.01)
(Continued)

(52) U.S. Cl.
CPC .......... *G06F 1/1637* (2013.01); *G02F 1/0063* (2013.01); *G06F 1/1658* (2013.01);
(Continued)

(58) Field of Classification Search
CPC .... G06F 1/1637; G06F 1/1658; G06F 3/0412; G06F 2200/16; G06F 2203/041; G02F 1/0063; H04M 1/0264; H04M 1/0266
See application file for complete search history.

(56) References Cited

U.S. PATENT DOCUMENTS 10,488,723 B2   11/2019  Lim et al.
11,131,890 B2   9/2021   Shi et al.
(Continued)

FOREIGN PATENT DOCUMENTS

CN   110922916 A   3/2020
CN   210836877 U   6/2020
(Continued)

OTHER PUBLICATIONS

International Search Report issued Feb. 10, 2022 in International Application No. PCT/CN2021/131310, 5 pages.
(Continued)

*Primary Examiner* — Michael Pervan
(74) *Attorney, Agent, or Firm* — XSENSUS LLP

(57) ABSTRACT

A display panel includes an array substrate, a composite functional layer, a first adhesive layer and a cover plate. The composite functional layer is located on a side of the light-emitting layer away from the base substrate. A through hole penetrating through the composite functional layer and the array substrate is formed on the array substrate and the
(Continued)

composite functional layer. The array substrate includes a non-display area surrounding the through hole. The composite functional layer includes a first shading layer, and the orthographic projection of the first shading layer on the array substrate is located in the non-display area of the array substrate. The first adhesive layer is located on a side of the composite functional layer away from the base substrate. The cover plate is located on a side of the first adhesive layer away from the base substrate.

20 Claims, 8 Drawing Sheets

(51) Int. Cl.
  *G06F 3/041* (2006.01)
  *H04M 1/02* (2006.01)
(52) U.S. Cl.
  CPC ........ *G06F 3/0412* (2013.01); *H04M 1/0264* (2013.01); *H04M 1/0266* (2013.01); *G06F 2200/16* (2013.01); *G06F 2203/041* (2013.01)

(56) References Cited

U.S. PATENT DOCUMENTS

2018/0143499 A1 5/2018 Lim et al.
2020/0341306 A1 10/2020 Shi et al.

FOREIGN PATENT DOCUMENTS

| CN | 111754877 A | 10/2020 |
| CN | 111856810 A | 10/2020 |
| CN | 112071825 A | 12/2020 |
| CN | 112885243 A | 6/2021 |
| CN | 214847489 U | 11/2021 |
| EP | 3 734 356 A1 | 11/2020 |

OTHER PUBLICATIONS

Written Opinion of the International Searching Authority issued Feb. 10, 2022 in International Application No. PCT/CN2021/131310, 4 pages.

DISPLAY PANEL AND MANUFACTURING METHOD THEREFOR, AND DISPLAY DEVICE

CROSS-REFERENCE TO RELATED APPLICATIONS

The present disclosure is a National Stage of International Application No. PCT/CN2021/131310 filed on Nov. 17, 2021, which claims priority to Chinese Patent Application No. 202110218983.6 entitled "Display panel and manufacturing method therefor, and display device", filed on Feb. 26, 2021, and both the entire contents of which are incorporated herein by reference.

TECHNICAL FIELD

The present disclosure relates to the field of display technology, and in particular, to a display panel and manufacturing method therefor, and a display device.

BACKGROUND

In the under-screen camera technology, the non-display area around a through hole of the camera is usually blocked by ink coated on the cover plate to avoid light leakage in the non-display area. However, due to a fitting error when the cover plate is fitted, a larger frame width needs to be reserved around the through hole of the camera.

It should be noted that the information disclosed in the above background part is for enhancement of understanding of the background of the present disclosure, and therefore may contain information that does not constitute the prior art known to those of ordinary skill in the art.

SUMMARY

According to an aspect of the present disclosure, there is provided a display panel, where the display panel includes: an array substrate, a composite functional layer, a first adhesive layer and a cover plate; the composite functional layer is located on a side of the light-emitting layer away from the base substrate, and a through hole penetrating the composite functional layer and the array substrate is formed in the array substrate and the composite functional layer; where, the array substrate includes a non-display area surrounding the through hole, the composite functional layer includes a first shading layer, and an orthographic projection of the first shading layer on the array substrate is located in the non-display area of the array substrate; the first adhesive layer is located on a side of the composite functional layer away from the base substrate; the cover plate is located on a side of the first adhesive layer away from the base substrate.

In some embodiments of the present disclosure, the orthographic projection of the first shading layer on the array substrate overlaps with the non-display area of the array substrate.

In some embodiments of the present disclosure, an opening of the through hole is circular, and the non-display area is annular.

In some embodiments of the present disclosure, the array substrate further includes an encapsulation layer and a touch functional layer; the encapsulation layer is located on a side of the light-emitting layer away from the base substrate; the touch functional layer is located on a side of the encapsulation layer away from the base substrate; and the first shading layer is located on a side of the touch functional layer away from the base substrate.

In some embodiments of the present disclosure, the composite functional layer further includes a second adhesive layer and a polarizer; the second adhesive layer is located on a side of the first shading layer away from the base substrate; and the polarizer is located on a side of the second adhesive layer away from the base substrate.

In some embodiments of the present disclosure, the composite functional layer further includes a third adhesive layer located on a side of the polarizer away from the base substrate; and the display panel further includes a privacy film located between the first adhesive layer and the third adhesive layer.

In some embodiments of the present disclosure, the light-emitting layer includes a plurality of light-emitting units, and the composite functional layer further includes a color film layer; the color film layer includes a plurality of color filter parts and a shading part located among the plurality of the color filter parts; the plurality of the color filter parts and the plurality of the light-emitting units are arranged in one-to-one correspondence, and an orthographic projection of a color filter part on the base substrate at least partially overlaps with an orthographic projection of a corresponding light-emitting unit on the base substrate; where, the shading part and the first shading layer are formed on a same structural layer of the array substrate, the shading part and the first shading layer are formed of a same material, and an orthographic projection of the color film layer on the base substrate surrounds at least part of the orthographic projection of the first shading layer on the array substrate.

In some embodiments of the present disclosure, a thickness of the first shading layer is greater than a thickness of the shading part.

In some embodiments of the present disclosure, a thickness of the first shading layer is 4-10 microns.

In some embodiments of the present disclosure, the composite functional layer further includes a fourth adhesive layer located on a side of the color film layer away from the base substrate; the display panel further includes a privacy film located between the first adhesive layer and the fourth adhesive layer.

In some embodiments of the present disclosure, the display panel further includes a second shading layer located between the first adhesive layer and the cover plate, the second shading layer includes an inner ring part and an outer ring part surrounding the inner ring part, an orthographic projection of the outer ring part on the array substrate covers the non-display area, and an orthographic projection of a sidewall of the through hole on a plane of the array substrate surrounds an orthographic projection of the inner ring part on the plane of the array substrate.

In some embodiments of the present disclosure, a material of the first shading layer is a shading photoresist material or ink; and a material of the second shading layer is a shading photoresist material or ink.

In some embodiments of the present disclosure, the display panel is a flexible display panel.

According to an aspect of the present disclosure, there is provided a display device comprising the above display panel and a camera device; and at least a part of the camera device is located in the through hole of the display panel.

According to an aspect of the present disclosure, there is provided a method for manufacturing a display panel, comprising:

providing an array substrate to be perforated, where the array substrate to be perforated includes a base substrate and a light-emitting layer, and the array substrate to be perforated further includes an area to be perforated and a non-display area surrounding the area to be perforated;

forming a composite functional layer to be perforated on a side of the light-emitting layer away from the base substrate, where the composite functional layer to be perforated includes a first shading material layer;

forming a through hole in the area to be perforated of the array substrate to be perforated, where the through-hole penetrates the array substrate and the composite functional layer, and an orthographic projection of the perforated first shading material layer on the array substrate is located in the non-display area of the array substrate;

adhering a cover plate on a side of the composite functional layer away from the base substrate through a first adhesive layer.

In some embodiments of the present disclosure, the orthographic projection of the perforated first shading material layer on the array substrate overlaps with the non-display area of the array substrate.

In some embodiments of the present disclosure, an opening of the through hole is circular, and the non-display area is annular.

In some embodiments of the present disclosure, the array substrate to be perforated further includes:
an encapsulation layer, located on a side of the light-emitting layer away from the base substrate; and
a touch functional layer, located on a side of the encapsulation layer away from the base substrate;
the first shading layer is located on a side of the touch functional layer away from the base substrate.

In some embodiments of the present disclosure, the forming the composite functional layer to be perforated on the side of the light-emitting layer away from the base substrate to be perforated, includes
forming the first shading material layer on the side of the light-emitting layer away from the base substrate to be perforated by a photolithography process;
where, the first shading material layer includes a first shading part and a second shading part surrounding the first shading part, an orthographic projection of the first shading part on the array substrate overlaps with the area to be perforated, and an orthographic projection of the second shading part on the array substrate surrounds the area to be perforated and is located in the non-display area of the array substrate.

In some embodiments of the present disclosure, the forming the composite functional layer to be perforated on the side of the light-emitting layer away from the base substrate to be perforated, further includes:
forming a second adhesive layer on a side of the first shading layer away from the base substrate; and
forming a polarizer on a side of the second adhesive layer away from the base substrate.

In some embodiments of the present disclosure, the forming the composite functional layer to be perforated on the side of the light-emitting layer away from the base substrate to be perforated, further includes:
forming a third adhesive layer on a side of the polarizer away from the base substrate;
the method for manufacturing the display panel further includes:
forming a privacy film between the first adhesive layer and the third adhesive layer.

In some embodiments of the present disclosure, the light-emitting layer includes a plurality of light-emitting units, and the forming the composite functional layer to be perforated on the side of the light-emitting layer away from the base substrate includes:
forming a color film layer on the side of the light-emitting layer away from the base substrate to be perforated, where the color film layer includes a plurality of color filter parts and a shading part located among the plurality of color filter parts, the plurality of the color filter parts and the plurality of the light-emitting units are arranged in a one-to-one correspondence, and an orthographic projection of a color filter part on the base substrate at least partially overlap with an orthographic projection of a corresponding light-emitting unit on the base substrate;
where, the shading part of the color film layer is formed in a same layer as the first shading material layer.

In some embodiments of the present disclosure, the forming the composite functional layer to be perforated on the side of the light-emitting layer away from the base substrate to be perforated, further includes:
increasing a thickness of the first shading material layer by at least one coating process;

In some embodiments of the present disclosure, the forming the composite functional layer to be perforated on the side of the light-emitting layer away from the base substrate to be perforated, further includes:
forming a fourth adhesive layer on a side of the color film layer away from the base substrate;
the method for manufacturing the display panel further includes:
forming a privacy film between the first adhesive layer and the fourth adhesive layer.

In some embodiments of the present disclosure, the forming the composite functional layer to be perforated on the side of the light-emitting layer away from the base substrate to be perforated, includes:
forming the first shading material layer on the side of the light-emitting layer away from the base substrate to be perforated by a photolithography process, where an orthographic projection of the first shading material layer on the array substrate overlaps with the non-display area of the array substrate.

In some embodiments of the present disclosure, the method for manufacturing the display panel further includes:
forming a second shading layer on a side of the cover plate to be fitted with the first adhesive layer, where the second shading layer includes an inner ring part and an outer ring part surrounding the inner ring part;
where, after the cover plate is fitted with the composite functional layer, an orthographic projection of the outer ring part on the array substrate covers the non-display area of the array substrate, and an orthographic projection of a sidewall of the through hole on a plane of the array substrate surrounds an orthographic projection of the inner ring part on the plane of the array substrate.

It is to be understood that the above general description and the following detailed description are exemplary and explanatory and are not restrictive of the present disclosure.

BRIEF DESCRIPTION OF THE DRAWINGS

The accompanying drawings, which are incorporated in and constitute a part of the description, illustrate embodiments consistent with the disclosure and together with the description serve to explain the principles of the disclosure.

Obviously, the drawings in the following description are some embodiments of the present disclosure, and for those of ordinary skill in the art, other drawings can also be obtained from these drawings without creative efforts.

DETAILED DESCRIPTION

Figure 1:
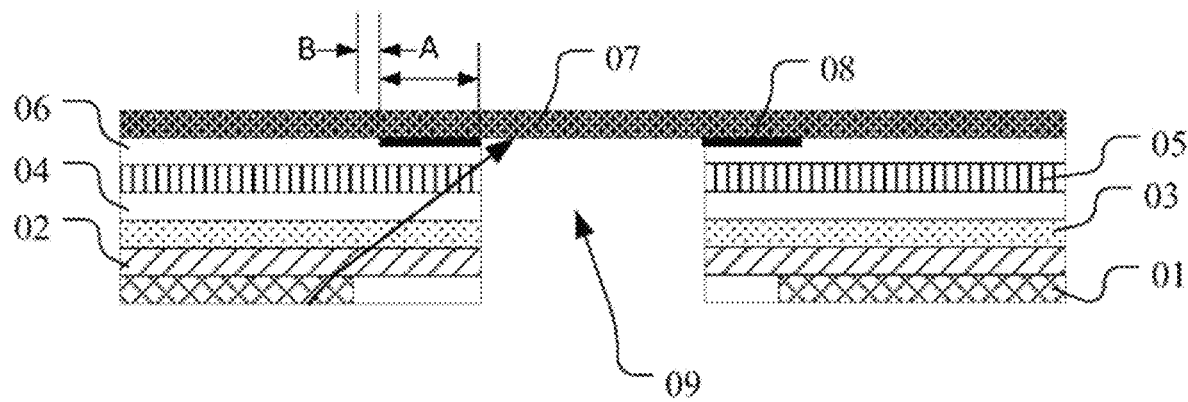
FIG. 1 is a schematic structural diagram of the display panel in the related art.

Example embodiments will now be described more fully with reference to the accompanying drawings. Example embodiments, however, can be implemented in various forms and should not be construed as limited to the embodiments set forth herein; by contrast, these embodiments are provided so that the present disclosure will be thorough and complete, and will fully convey the concept of example embodiments to those skilled in the art. The same reference numerals in the drawings denote the same or similar structures, and thus their detailed descriptions will be omitted.

Although relative terms such as "upper" and "lower" are used in the description to describe the relative relationship of one component of an icon to another component, these terms are used in the description for convenience, such as according to the direction of the example described in the drawings. It will be appreciated that if the device of the icon is turned upside down, the components described as "on" will become the components on "bottom". Other relative terms, such as "high", "low", "top", "bottom", "left" and "right", also have similar meanings. When a certain structure is "on" other structures, it may mean that a certain structure is integrally formed on other structures, or that a certain structure is "directly" arranged on other structures, or that a certain structure is "indirectly" arranged on another structure through other structures.

The terms "a", "an", "the", "said" and "at least one" are used to indicate the presence of one or more elements/components/etc.; the terms "include" and "have" are used to indicate an open-ended inclusion and means that there may be additional elements/components/etc. in addition to the listed elements/components/etc.

As shown in FIG. 1, which is a schematic structural diagram of a display panel in the related art, the display panel may include: a light-emitting layer 01, an encapsulation layer 02, a touch functional layer 03, a pressure-sensitive adhesive layer 04, a polarizer 05, an optical adhesive layer 06, and a cover plate 07. A through hole 09 is formed in the light-emitting layer 01, the encapsulation layer 02, the touch functional layer 03, the pressure-sensitive adhesive layer 04, the polarizer 05, and the optical adhesive layer 06. The through hole 09 can be used to arrange peripheral devices such as cameras. A non-display area needs to be provided around the through hole 09 on the display panel, and the non-display area can be used for integrating signal lines and packaging structures. In the related art, as shown in FIG. 1, an annular ink layer 08 may be formed on the side where the cover plate 07 and the optical adhesive layer 06 are adhered, and the annular ink layer 08 is arranged around the through hole 09. The annular ink layer 08 can be used to shade the light leakage in the above-mentioned non-display area. In the related art, due to process limitations, the minimum width of the annular ink layer 08 is A, and at the same time, due to the fitting error B when the cover plate is fitted, the frame width of the display panel is A+B, and the display panel has a wider frame. In addition, since the polarizer 05 and the touch functional layer 03 have relatively larger thicknesses, for example, the thickness of the polarizer 05 can reach 136 um, the thickness of the touch functional layer 03 can reach 48 um, some of the light (as indicated by the arrow in the FIG. 1) emitted by the light-emitting layer 01 will be refracted in the touch functional layer 03 and the polarizer 05, and will be emitted through the area of the through hole 09 is located, resulting in light leakage in the area of the through hole 09.

Based on this, there is provided first a method for manufacturing a display panel, according to some embodiments of the present disclosure. The method for manufacturing the display panel may include:

Step S1, an array substrate to be perforated is provided, the array substrate to be perforated includes a base substrate and a light-emitting layer, and the array substrate to be perforated further includes an area to be perforated and a non-display area surrounding the area to be perforated;

Step S2, a composite functional layer to be perforated is formed on a side of the light-emitting layer away from the base substrate, the composite functional layer to be perforated includes a first shading material layer;

Step S3, a through hole is formed in the area to be perforated of the array substrate to be perforated, the through-hole penetrates the array substrate and the composite functional layer, and an orthographic projection of the perforated first shading material layer on the array substrate is located in the non-display area of the array substrate;

Step S4, a cover plate is adhered on a side of the composite functional layer away from the base substrate through a first adhesive layer.

On one hand, compared with the related art, in the display panel manufactured by the method for manufacturing the display panel according to some embodiments of the present disclosure, there is a smaller distance between the first shading material layer and the light-emitting layer in the stacking direction, so that the first shading material layer has better shading effect. On another hand, the first shading material layer in some embodiments of the present disclosure can be formed by a photolithography process, and the photolithography process has high precision, so that the orthographic projection of the perforated first shading material layer on the array substrate overlaps with the non-display area of the array substrate, thereby avoiding the problem of large width of the non-display area caused by the fitting error of the cover plate.

The following embodiment the above steps will be described in detail according to the following embodiments.

As shown in FIGS. 2-8, a process flow chart of the method for manufacturing the display panel according to an embodiment of the present disclosure is shown. As shown in FIGS.

Figure 2:
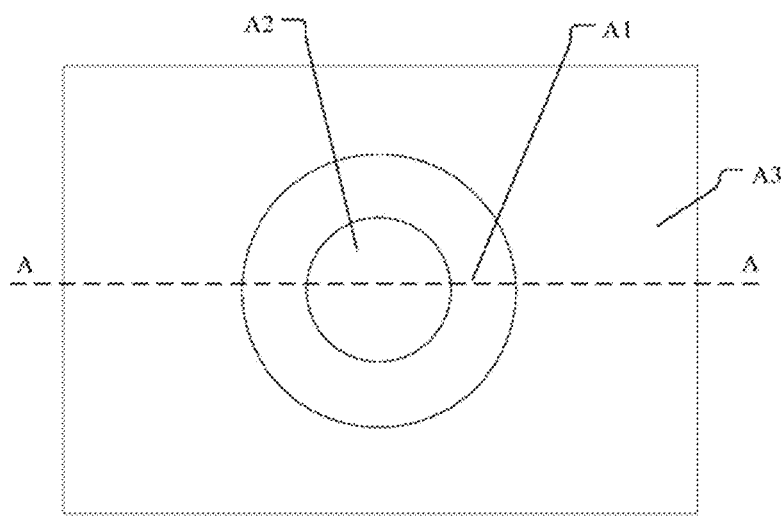
FIGS. 2-8 are process flow chart of the method for manufacturing the display panel according to an embodiment of the present disclosure.
Figure 3:
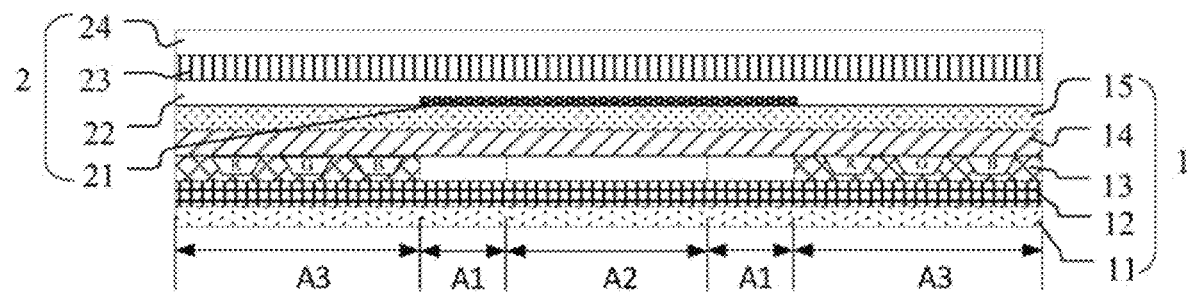

2 and 3, FIG. 2 shows a top view of an array substrate to be perforated according to an embodiment, and FIG. 3 shows a partial cross-sectional view of the display panel, and the cutting line of the cross-sectional view can be the dotted line A-A in FIG. 2. In step S1, an array substrate 1 to be perforated is provided, and the array substrate 1 to be perforated may include a base substrate 11, a circuit layer 12, a light-emitting layer 13, an encapsulation layer 14, and a touch functional layer 15 stacked in sequence 15. The light-emitting layer 13 may include a hole injection layer, a light-emitting material layer, an electron injection layer, etc. The light-emitting layer 13 may include a plurality of light-emitting units, and the plurality of light-emitting units may include R light-emitting units, G light-emitting units, and B light-emitting units. The circuit layer 12 may include pixel driving circuits, and the pixel driving circuits in the circuit layer 12 may be used to provide driving currents to the light-emitting units in the light-emitting layer. The encapsulation layer 14 may be used to encapsulate the light-emitting layer 13 to isolate the light-emitting layer 13 from external water and oxygen. The touch functional layer 15 may include a sensing signal line and an excitation signal line cross arranged and located in different conductive layers, and a protective layer located on the side of the sensing signal line and the excitation signal line away from the base substrate 11, and the protective layer may be an organic layer. The conductive layer where the sensing signal line is located can be formed by stacking a titanium layer, an aluminum layer, and a titanium layer, and the conductive layer where the excitation signal line is located can also be formed by stacking a titanium layer, an aluminum layer, and a titanium layer. The conductive layer where the sensing signal line is located and the conductive layer where the excitation signal line is located can be separated by an insulating layer. The touch functional layer 15 can determine the touched position of the display panel according to the capacitance change between the sensing signal line and the excitation signal lines. As shown in FIGS. 2 and 3, the array substrate 1 to be perforated may further include an area A2 to be perforated, a non-display area A1 surrounding the area A2 to be perforated, and a display area A3 surrounding the non-display area A1. The area A2 to be perforated may not be provided with an effective pixel unit, that is, the area A2 to be perforated is not used for displaying images. The non-display area A1 may be used to integrate signal lines (e.g., gate lines, data lines, etc.) and packaging structures (e.g., barrier dams in the encapsulation layer). As shown in FIG. 2, the area A2 to be perforated may be circular, and the non-display area A1 may be a circular ring concentric with area A2 to be perforated.

It should be understood that, in other embodiments, the array substrate 1 to be perforated may also have other structures. For example, the array substrate 1 to be perforated may not be provided with the touch functional layer 15, or the touch functional layer 15 may be arranged in other positions. The area A2 to be perforated may be in other shapes, for example, the area A2 to be perforated may be oval, rectangular, etc. Correspondingly, the non-display area A1 may be a ring shape with the same shape as the area A2 to be perforated, that is, the shape of the inner ring of the non-display area A1 is the same as the shape of the outer ring of the area A2 to be perforated.

Figure 4:
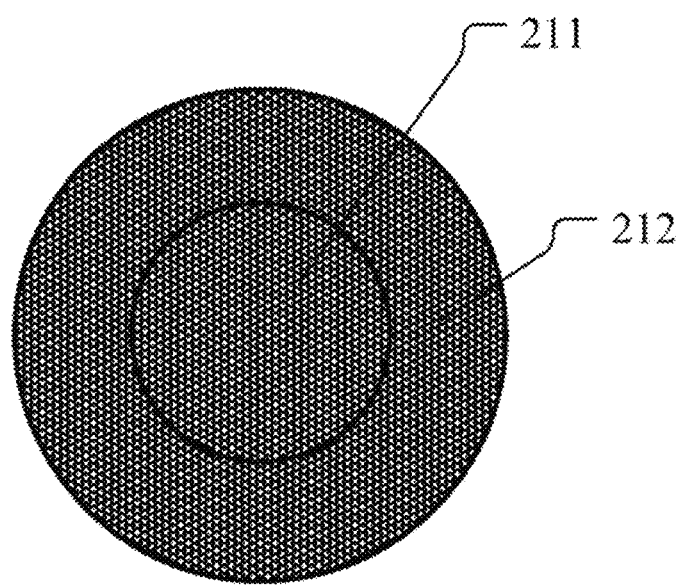

As shown in FIGS. 2, 3 and 4, FIG. 4 shows a top view of the first shading material layer in some embodiments. In step S2, the composite functional layer 2 to be perforated is formed on the side of the light-emitting layer 13 away from the base substrate 11. The step of forming the composite functional layer 2 to be perforated may include sequentially forming a first shading material layer 21, a second adhesive layer 22, a polarizer 23, and a third adhesive layer 24 on the side of the touch functional layer 15 away from the base substrate. That is, the composite functional layer 2 to be perforated may include the first shading material layer 21, the second adhesive layer 22, the polarizer 23, and the third adhesive layer 24 stacked in sequence. The second adhesive layer 22 may be a pressure-sensitive adhesive layer, and the third adhesive layer 24 may be an optical adhesive layer. The second adhesive layer 22 can fill the thickness difference formed in the first shading material layer 21. The first shading material layer 21 may include a first shading part 211 and a second shading part 212 surrounding the first shading part 211. The orthographic projection of the first shading part 211 on the array substrate 1 to be perforated may overlap with the area A2 to be perforated, the orthographic projection of the second shading part 212 on the array substrate 1 to be perforated may overlap with the non-display area A1 of the array substrate. The material of the first shading material layer 21 may be a shading photoresist material, such as a black photoresist material. The first shading material layer 21 can be formed by a photolithography process. Since the photolithography process has high precision, the orthographic projection of the second shading part 212 on the array substrate 1 to be perforated can completely overlap with the non-display area A1. Therefore, the display panel manufactured by the method does not need to reserve a fitting error in the frame area, so that the manufactured display panel has a smaller frame width.

Figure 5:
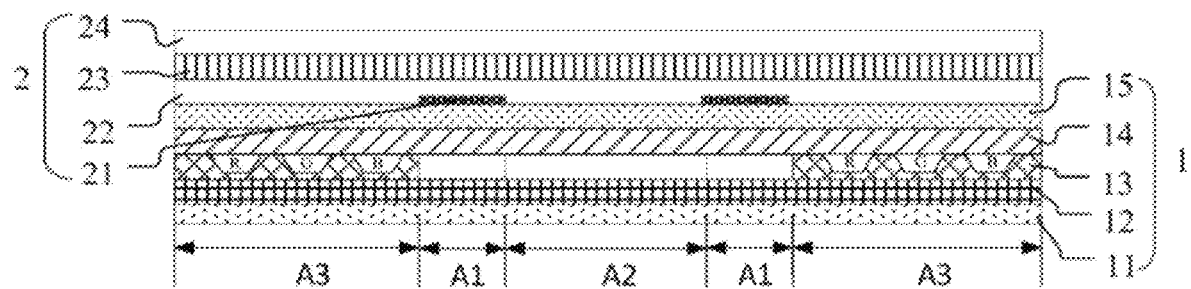
Figure 6:
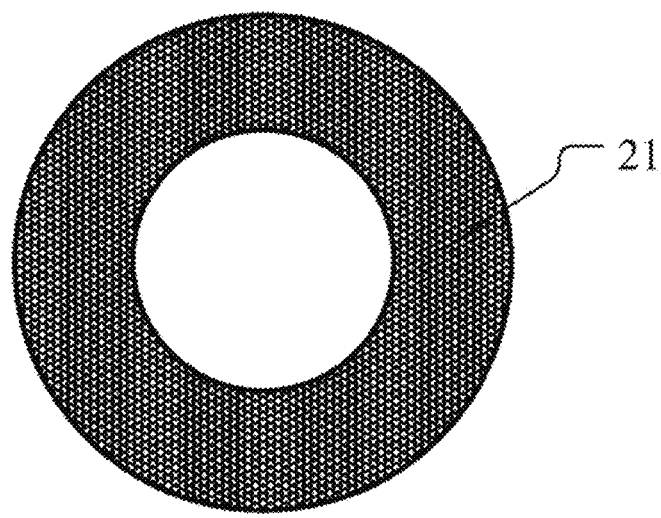

It should be understood that, in some other embodiments, the first shading material layer 21 may also be located at other positions, and the first shading material layer 21 may also be formed of other materials in other ways. For example, the first shading material layer 21 may be located between the polarizer 23 and the third adhesive layer 24. The material of the first shading material layer 21 may be ink, and the first shading material layer 21 may be formed by a process such as ink transfer, mask plate coating, and the like. In addition, the first shading material layer 21 may also be in other shapes. For example, as shown in FIGS. 5 and 6, FIG. 5 shows a cross-sectional view of the array substrate to be perforated and the composite functional layer to be perforated after fitted in another embodiment, and FIG. 6 shows a top view of the first shading material layer 21 in another embodiment. In these embodiments, when the first shading material layer 21 is formed by the photolithography process, the first shading material layer 21 may be directly formed into the shape of the second shading portion 212 in FIG. 4, so that the shading material layer 21 does not need to be cut when the through hole is formed.

Figure 7:
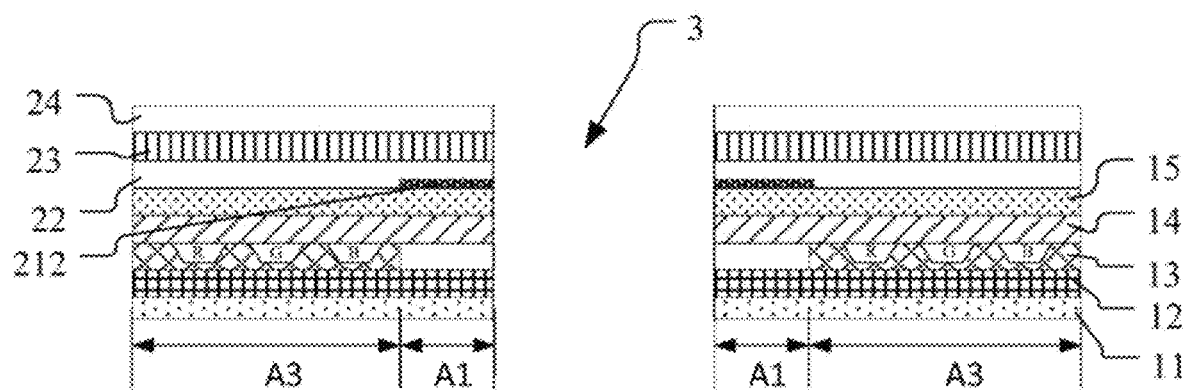

As shown in FIG. 7, in step S3, the method for manufacturing the display panel may further include: forming a through hole 3 in the area A2 to be perforated. The through-hole 3 may penetrate through the array substrate 1 to be perforated and the composite functional layer 2 to be perforated. Specifically, the through hole 3 can be formed by a laser cutting process. After the through hole 3 is formed, the first shading part 211 of the first shading material layer 21 is cut off, and the second shading part 212 remains in the first shading material layer 21.

Figure 8:
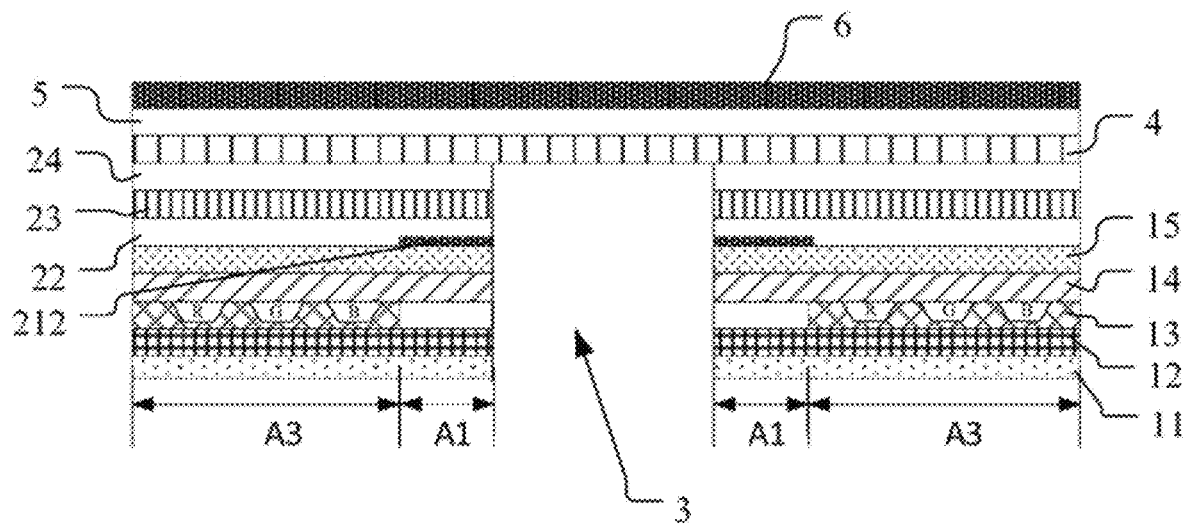

In some embodiments, as shown in FIG. 8, in step S4, the method for manufacturing the display panel may further include: adhering a cover plate 6 on the side of the composite functional layer 2 away from the base substrate 11 through the first adhesive layer 5. As shown in FIG. 8, the method for manufacturing the display panel may further include: forming a privacy film 4 between the first adhesive layer 5 and the third adhesive layer 24. Among them, the shutter structure of the privacy film 4 can shield most of the light from the viewing angle of 45°-90°, so that the amount of light leakage in the through hole 3 can be further reduced. The first adhesive layer 5 may be an optical adhesive layer.

Figure 9:
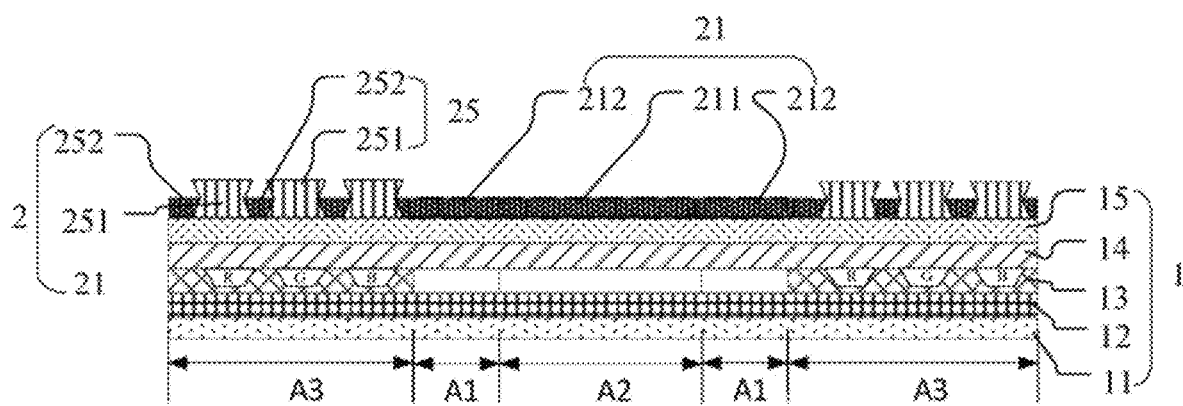
FIGS. 9-18 are process flow chart of the method for manufacturing the display panel according to another embodiment of the present disclosure.

In some embodiments, the composite functional layer 2 to be perforated may also have other structures. As shown in FIGS. 9-18, a process flow chart of the method for manufacturing the display panel according to some embodiments the present disclosure is shown. As shown in FIG. 9, in step S2, forming the composite functional layer to be perforated on the side of the light-emitting layer away from the base substrate may include: forming a color film layer 25 on the side of the touch functional layer 15 away from the base substrate 11 perforated. The color film layer 25 may include a plurality of color filter parts 251 and a shading part 252 located among the plurality of color filter parts 251. The color filter parts 251 are arranged in a one-to-one correspondence with a plurality of the light-emitting units R, G, B, and the orthographic projection of a color filter part 251 on the base substrate 11 to be perforated and the orthographic projection of a corresponding light-emitting unit on the base substrate 11 may at least partially overlap with each other. For example, the orthographic projection of the color filter part 251 on the base substrate 11 may cover the orthographic projection of the corresponding light-emitting unit on the base substrate 11. The shading part 252 of the color film layer 25 may be formed in the same layer as the first shading material layer 21, that is, the shading part 252 and the first shading material layer 21 may be formed by a single patterning process. The color film layer 25 can replace the polarizer to avoid reflection of the display panel. The first shading material layer 21 may also include a first shading part 211 and a second shading part 212 surrounding the first shading part 211.

Figure 10:
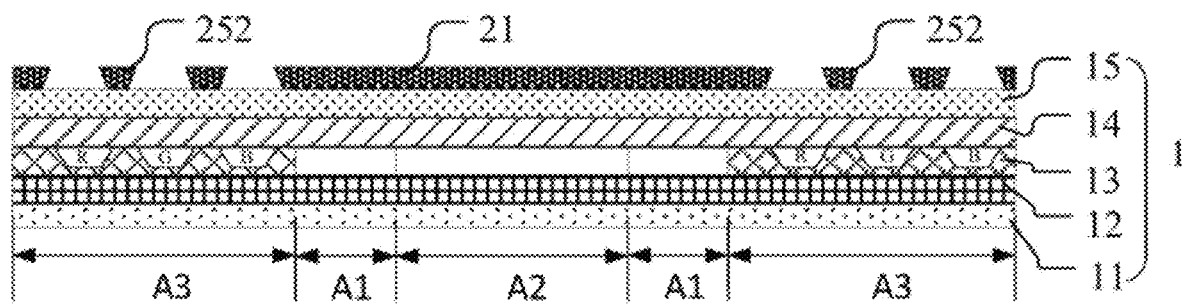
Figure 11:
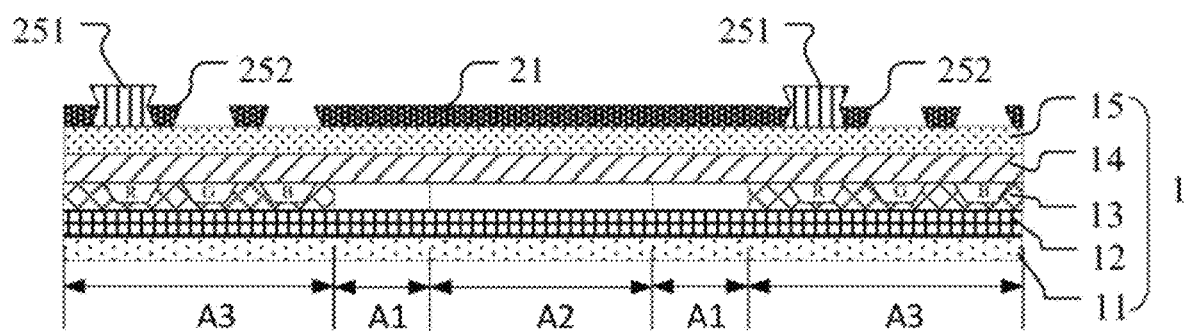
Figure 12:
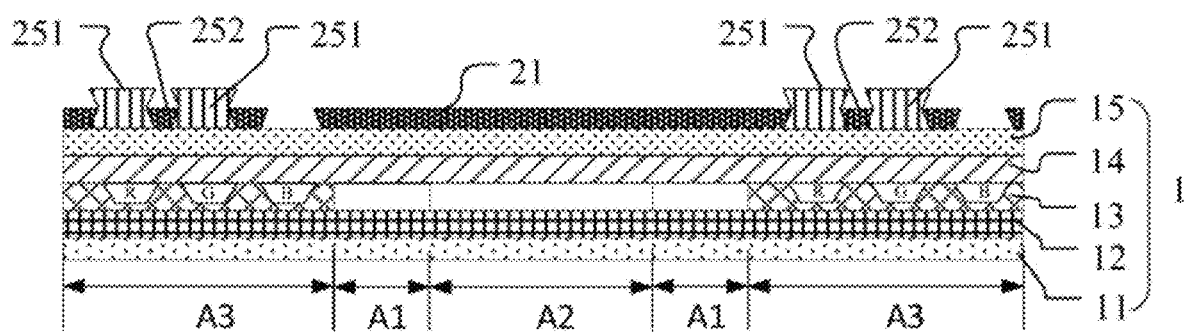
Figure 13:
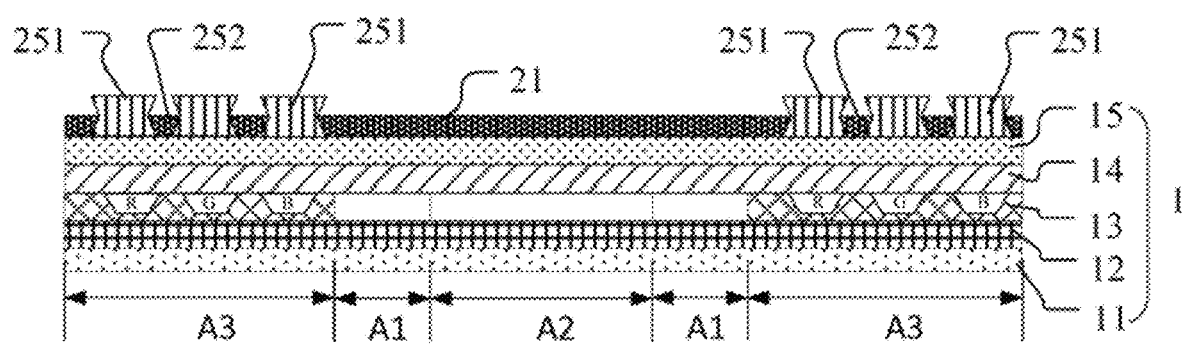

In some embodiments, the specific manner of forming the color film layer 25 may include: as shown in FIG. 10, forming a shading photoresist layer on the side of the touch functional layer 15 away from the base substrate 11, and performing etching and developing on the photoresist layer by a photolithography process to form the first shading material layer 21 and the shading part 252 of the color film layer. The shading photoresist layer may be a black photoresist layer. Then, as shown in FIGS. 11, 12 and 13, the red filter part 251 corresponding to the R light-emitting unit, the green filter part 251 corresponding to the G light-emitting unit, and the blue filter part 251 corresponding to the B light-emitting unit may be sequentially formed through multiple mask processes. As shown in FIGS. 10-13, the thickness of the color filter part 251 may be greater than the thickness of the shading part 252, so that the color filter part 251 can filter the light emitted by the light-emitting units under a larger viewing angle.

Figure 14:
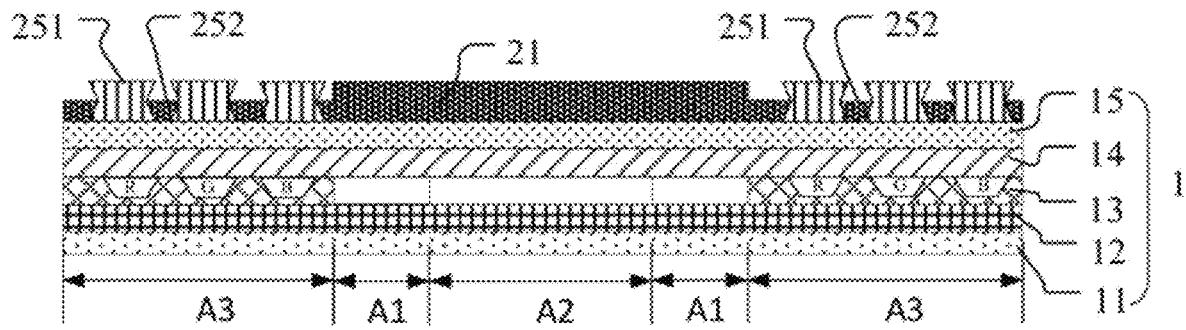

In some embodiments, in order to further reduce the transmittance of the first shading material layer and increase the shading effect of the first shading material layer 21, as shown in FIG. 14, forming the composite functional layer to be perforated on the side of the touch functional layer 15 away from the base substrate 11 to be perforated may further include: increasing the thickness of the first shading material layer 21 through one or more coating processes. It should be understood that, in some embodiments, there may be other ways to form a thicker first shading material layer 21. For example, a thicker shading photoresist layer may be formed on the side of the touch functional layer 15 away from the base substrate 11, and the shading photoresist layer is photolithographed through a halftone mask process, thereby forming a thicker first shading material layer 21 and a thinner shading part 252. The thickness of the first shading layer may be 4-10 microns, such as 4 microns, 6 microns, 8 microns, 10 microns and the like.

Figure 15:
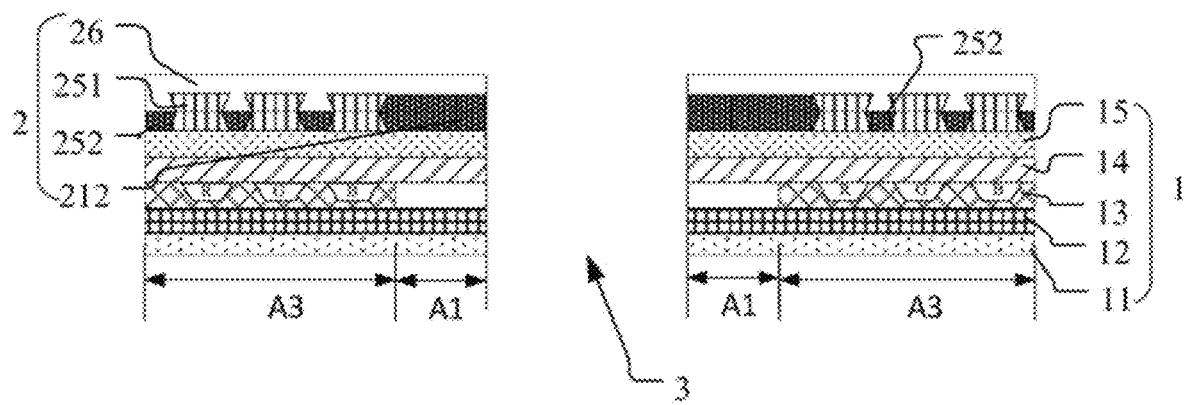

In some embodiments, as shown in FIG. 15, forming the composite functional layer to be perforated on the side of the light-emitting layer 15 away from the base substrate 11 to be perforated may further include: forming a fourth adhesive layer 26 on the side of the color film layer 25 away from the base substrate 11. Similarly, the method for manufacturing the display panel further includes: forming a through hole 3 in the area A2 to be perforated of the array substrate 1 to be perforated, where the through hole 3 can penetrate the array substrate 1 to be perforated and the composite functional layer 2 to be perforated, and the fourth adhesive layer 26 may be an optical adhesive layer.

Figure 16:
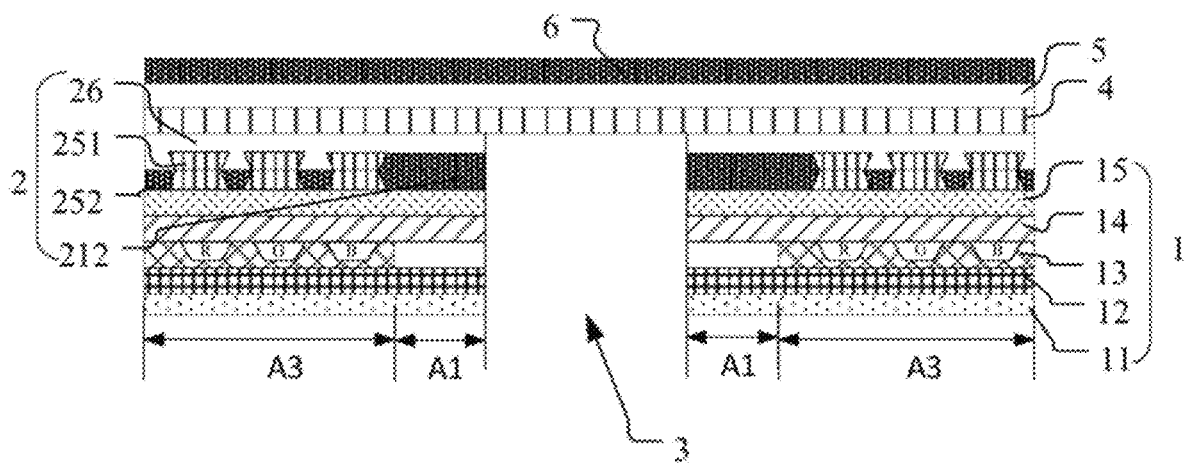

As shown in FIG. 16, the method for manufacturing the display panel may further include: adhering the cover plate 6 on the side of the perforated composite functional layer 2 away from the base substrate 11 through the first adhesive layer 5. As shown in FIG. 16, the method for manufacturing the display panel may further include: forming a privacy film 4 between the first adhesive layer 5 and the fourth adhesive layer 26. The shutter structure of the privacy film 4 can shield most of the light from the viewing angle of 45°-90°, so that the amount of light leakage in the through hole 3 can be further reduced.

Figure 17:
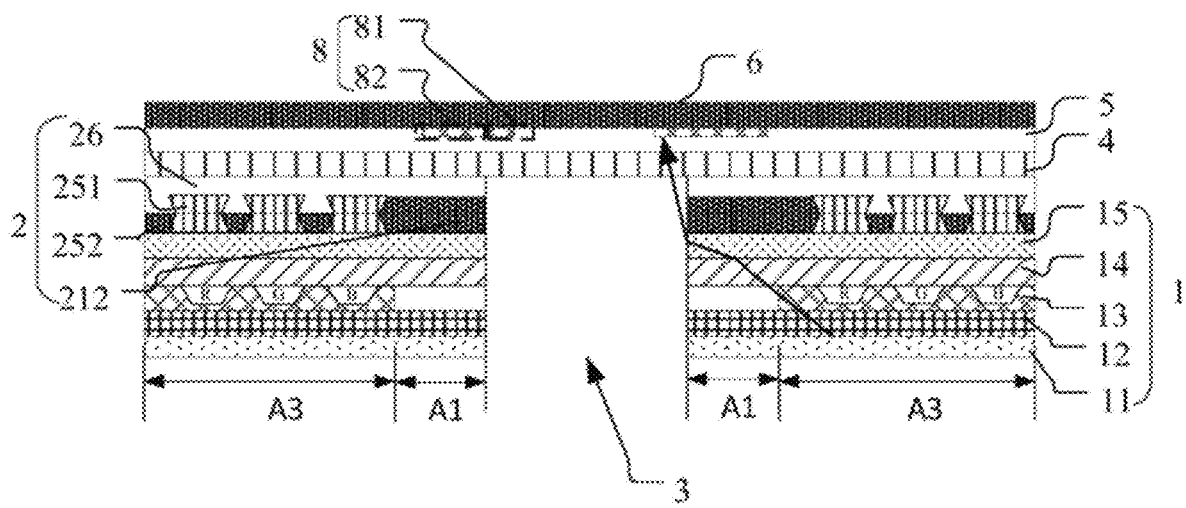
Figure 18:
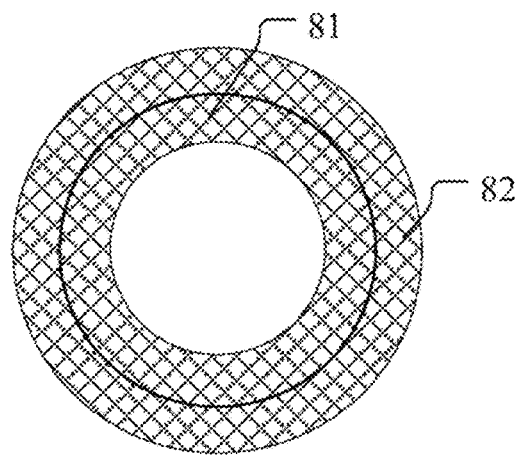

As shown in FIGS. 17 and 18, FIG. 18 shows a schematic structural diagram of the second shading layer in some embodiments. The method for manufacturing the display panel may further include: forming a second shading layer 8 on the side of the cover plate to be fitted with the first adhesive layer. The second shading layer 8 may include an inner ring part 81 and an outer ring part 82 surrounding the inner ring part 81. After the cover plate 6 is fitted with the composite functional layer 2, the orthographic projection of the outer ring part 82 on the array substrate 1 can cover at least part of the non-display area A1 of the array substrate. The orthographic projection of the side wall of the through hole 3 on the plane where the array substrate 1 is located surrounds the orthographic projection of the inner ring part 81 on the plane where the array substrate 1 is located, and the orthographic projection of the annular second shading layer 8 on the plane where the array substrate is located may be concentric with the orthographic projection of the through hole 3 on the plane where the array substrate is located. The material of the second shading layer 8 can be ink, and the second shading layer 8 formed on the side of the cover plate to be fitted with the first adhesive layer can be formed by an ink transfer process or a coating process. As shown in FIG. 17, the light indicated by the arrow can be transmitted into the through hole 3 by multiple refraction, and the second shading layer 8 can further shield the light in the through hole 3.

Figure 19:
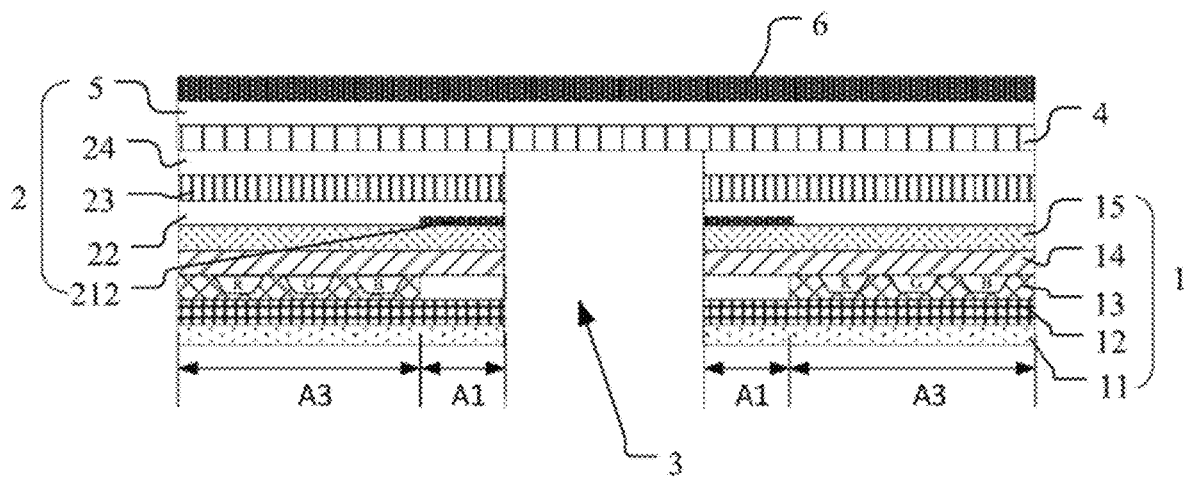
FIG. 19 is a schematic structural diagram of the display panel according to an embodiment of the present disclosure.

There is provided a display panel according to some embodiments of the present disclosure, which can be manufactured by the above-mentioned method for manufacturing a display panel. As shown in FIG. 19, a schematic structural diagram of display panel according to some embodiments of the present disclosure is shown. The display panel may include: an array substrate 1, a composite functional layer 2, a first adhesive layer 5, and a cover plate 6. The array substrate 1 may include a base substrate 11 and a light-emitting layer 13. The composite functional layer 2 may be located on the side of the light-emitting layer 13 away from the base substrate 11, and the array substrate 1 and the composite functional layer 2 may be formed with a through holes 3 penetrating the composite functional layer 2 and the array substrate 1. The array substrate 1 may include a non-display area A1 surrounding the through hole 3. The composite functional layer 2 may include a first shading layer 212, and the orthographic projection of the first shading layer 212 on the array substrate 1 may be located in the non-display area A1 of the array substrate 1. The orthographic projection of the first shading layer 212 on the array substrate 1 may overlap with the non-display area A1 of the array substrate 1. The first adhesive layer 5 can be located on the side of the composite functional layer 2 away from the base substrate 11. The cover plate 6 can be located on the side of the first adhesive layer 5 away from the base substrate 11.

In some embodiments, the opening of the through hole 3 may be circular, and the non-display area A1 may be annular. In some other embodiments, the opening of the through hole 3 may also be in other shapes. For example, the opening of the through hole 3 may be oval, rectangular, etc. Correspondingly, the non-display area A1 may be a same circular ring as the opening of the through hole 3, that is, the shape of the inner ring and the outer ring of the non-display area A1 is the same as the shape of the opening of the through hole 3.

In some embodiments, the array substrate may further include: an encapsulation layer 14, a touch functional layer 15, and a circuit layer 12. The circuit layer 12 may be located between the light-emitting layer 13 and the base substrate 11. The encapsulation layer 14 may be located on the side of the light-emitting layer 13 away from the base substrate 11. The touch functional layer 15 may be located on the side of the encapsulation layer 14 away from the base substrate 11. The first shading layer 212 may be located on the side of the touch functional layer 15 away from the base substrate 11.

In some embodiments, the composite functional layer 2 may further include: a second adhesive layer 22 and a polarizer 23. The second adhesive layer 22 is located on the side of the first shading layer 212 away from the base substrate 11. The polarizer 23 is located on the side of the second adhesive layer 22 away from the base substrate 11.

In some embodiments, the composite functional layer 2 may further include a third adhesive layer 24, and the third adhesive layer 24 is located on the side of the polarizer 23 away from the base substrate 11. The display panel may further include a privacy film 4, and the privacy film 4 may be located between the first adhesive layer 5 and the third adhesive layer 24.

Figure 20:
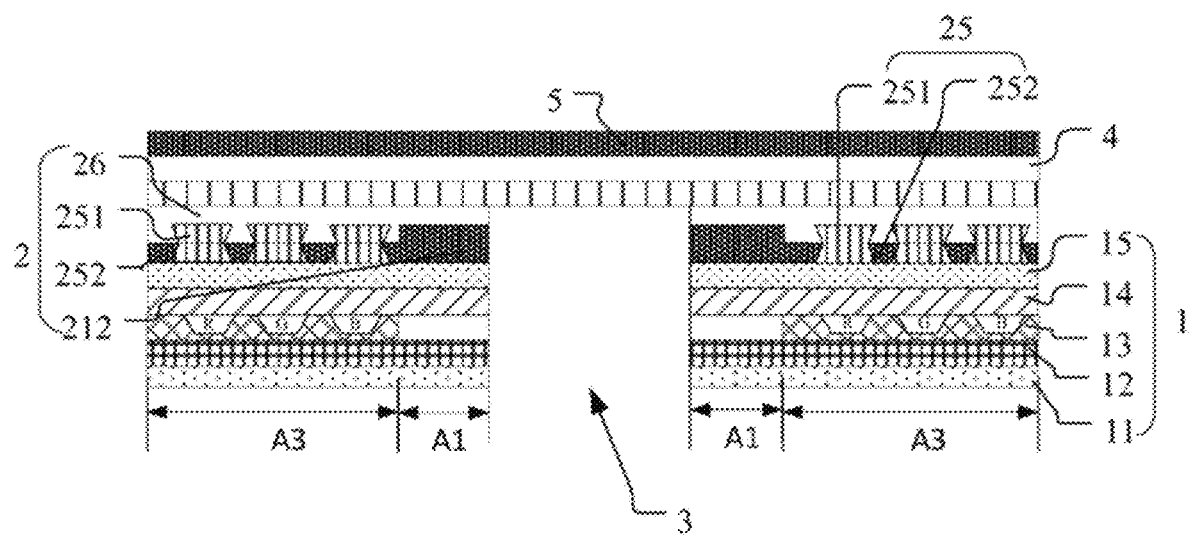
FIG. 20 is a schematic structural diagram of the display panel according to another embodiment of the present disclosure.
Figure 21:
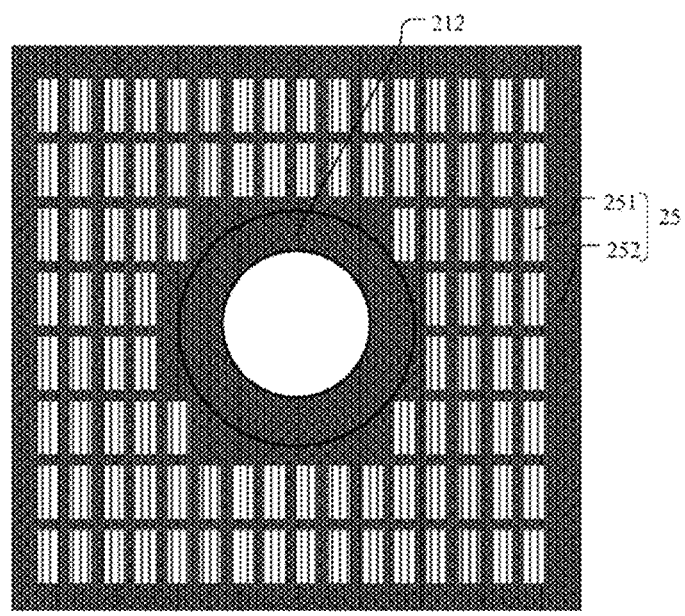
FIG. 21 is a top view of the color film layer and the first shading layer in FIG. 20.

In some embodiments, as shown in FIGS. 20 and 21, it is a schematic structural diagram of the display panel according to another embodiment of the present disclosure. As shown in FIG. 21, it is a top view of the color film layer and the first shading layer in FIG. 20. The light-emitting layer includes a plurality of R, G, B light-emitting units. The composite functional layer 2 may further include a color film layer 25. The color film layer 25 may include a plurality of color filter parts 251 and a shading part 252 between the color filter parts 251. The plurality of the color filter parts 251 are arranged in a one-to-one correspondence with the plurality of the R, G, B, light-emitting units. The orthographic projection of a color filter part 251 on the base substrate 11 and the orthographic projection of a corresponding light-emitting unit on the base substrate 11 at least partially overlap with each other. For example, the orthographic projection of the color filter part 251 on the base substrate 11 may cover the orthographic projection of the corresponding light-emitting unit on the base substrate 11.

Figure 22:
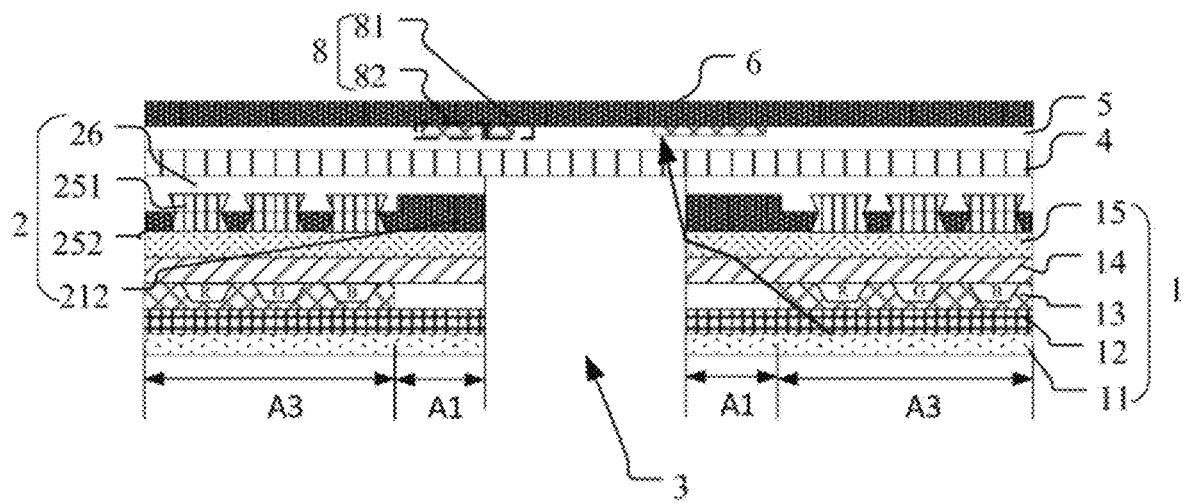
FIG. 22 is a schematic structural diagram of the display panel according to another embodiment of the present disclosure.

The color film layer 25 and the first shading layer 212 are formed on the same structural layer of the array substrate 1. For example, both the color film layer 25 and the first shading layer 212 may be formed on the touch functional layer 15 of the array substrate 1. The orthographic projection of the color film layer 25 on the base substrate 11 may surround the orthographic projection of the first shading layer 212 on the array substrate 1. As shown in FIGS. 21 and 22, the distribution structure of the color filter parts 251 on the color film layer 25 may be the same as the distribution structure of the light-emitting units on the light-emitting layer, where the distribution structure of the light-emitting units on the light-emitting layer may be a true RGB structure, RGGB structure, etc.

In some embodiments, the thickness of the first shading layer 212 may be greater than the thickness of the shading part 252. The thickness of the first shading layer may be 4-10 microns, such as 4 microns, 6 microns, 8 microns, 10 microns.

In some embodiments, the composite functional layer 2 may further include: a fourth adhesive layer 26. The fourth adhesive layer 26 is located on the side of the color film layer 25 away from the base substrate 11. The display panel further includes a privacy film 4, and the privacy film is located between the first adhesive layer and the fourth adhesive layer.

In some embodiments, as shown in FIG. 22, it is a schematic structural diagram of the display panel according to another embodiment of the present disclosure. The display panel further includes a second shading layer 8, which may be located between the first adhesive layer 5 and the cover plate 6. The second shading layer 8 may include an inner ring part 81 and an outer ring part 82 surrounding the inner ring part 81. The orthographic projection of the outer ring part 82 on the array substrate may cover at least part of the non-display area A1, and the orthographic projection of the sidewall of the through hole 3 on a plane where the array substrate 1 is located may surround the orthographic projection of the inner ring part 81 on the plane where the array substrate 1 is located. The material of the second shading layer 8 can be ink, the second shading layer 8 can be formed on the cover plate 6 through an ink transfer process or a coating process, and then the cover plate can be fitted with the privacy film 4 by a fitting process. It should be understood that the material of the second shading layer 8 may also be a shading photoresist material, and the second shading layer 8 may be formed on the side of the privacy film 4 away from the base substrate 11 by a photolithography process.

In some embodiments, the display panel shown in FIGS. 19-22 may be a flexible display panel.

Figure 23:
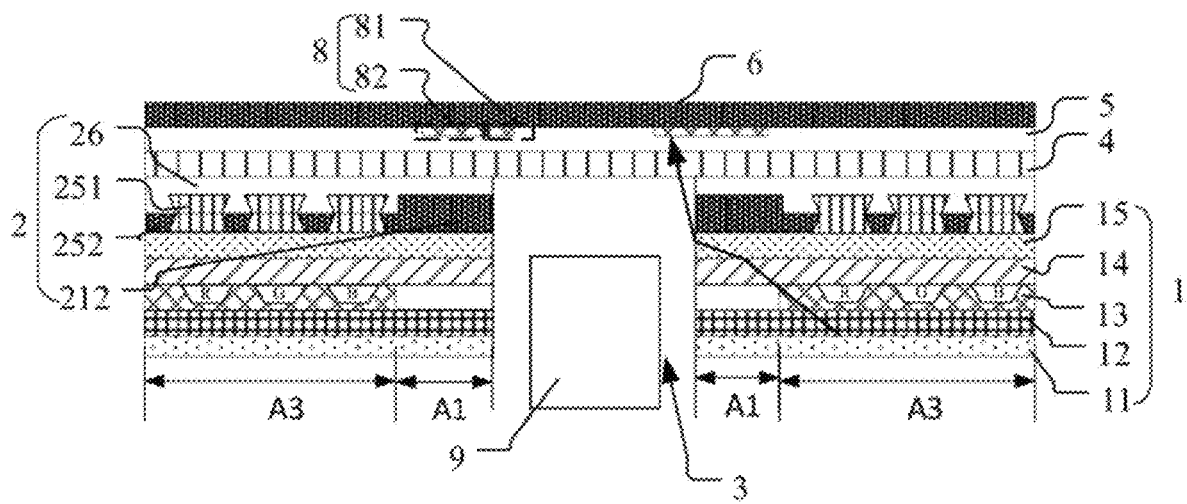
FIG. 23 is a schematic structural diagram of the display device according to an embodiment of the present disclosure.

In some embodiments, there is further provided a display device. As shown in FIG. 23, it is a schematic structural diagram of the display device according to an embodiment of the present disclosure. The display device may include the above-mentioned display panel and a camera device 9. At least part of the camera device 9 may be located in the through hole 3 of the display panel. The display device may be a display device such as a mobile phone, a tablet computer and the like.

Those skilled in the art will easily think of other embodiments of the present disclosure after considering the description and practicing the contents disclosed here. The present application is intended to cover any variation, use or adaptive change of the present disclosure, which follows the general principles of the present disclosure and includes the common knowledge or customary technical means in the technical field not disclosed in the present disclosure. The description and the embodiments are considered as exemplary, and the true scope and spirit of the present disclosure are indicated by the claims.

It should be understood that the present disclosure is not limited to the precise structure already described above and shown in the drawings, and various modifications and changes may be made without departing from the scope. The scope of the present disclosure is limited by the appended claims.

What is claimed is:

1. A display panel, wherein the display panel comprises:
   an array substrate, comprising a base substrate and a light-emitting layer;
   a composite functional layer, located on a side of the light-emitting layer away from the base substrate, wherein a through hole penetrating the composite functional layer and the array substrate is formed in the array substrate and the composite functional layer;
   wherein, the array substrate comprises a non-display area surrounding the through hole, the composite functional layer comprises a first shading layer, and an orthographic projection of the first shading layer on the array substrate is located in the non-display area of the array substrate;
   a first adhesive layer, located on a side of the composite functional layer away from the base substrate; and
   a cover plate, located on a side of the first adhesive layer away from the base substrate,
   wherein the light-emitting layer comprises a plurality of light-emitting units, and the composite functional layer further comprises:
   a color film layer, comprising a plurality of color filter parts and a shading part located among the plurality of the color filter parts, wherein the plurality of the color filter parts and the plurality of the light-emitting units are arranged in one-to-one correspondence, and an orthographic projection of a color filter part on the base substrate at least partially overlaps with an orthographic projection of a corresponding light-emitting unit on the base substrate; and
   wherein, the shading part and the first shading layer are formed on a same structural layer of the array substrate, the shading part and the first shading layer are formed of a same material, and an orthographic projection of the color film layer on the base substrate surrounds at least part of an orthographic projection of the first shading layer on the array substrate.

2. The display panel according to claim 1, wherein the orthographic projection of the first shading layer on the array substrate overlaps with the non-display area of the array substrate.

3. The display panel according to claim 1, wherein an opening of the through hole is circular, and the non-display area is annular.

4. The display panel according to claim 1, wherein the array substrate further comprises:
   an encapsulation layer, located on a side of the light-emitting layer away from the base substrate; and
   a touch functional layer, located on a side of the encapsulation layer away from the base substrate;
   wherein the first shading layer is located on a side of the touch functional layer away from the base substrate.

5. The display panel according to claim 1, wherein the composite functional layer further comprises:
   a second adhesive layer, located on a side of the first shading layer away from the base substrate; and
   a polarizer, located on a side of the second adhesive layer away from the base substrate.

6. The display panel according to claim 5, wherein the composite functional layer further comprises:
   a third adhesive layer, located on a side of the polarizer away from the base substrate;
   wherein the display panel further comprises:
   a privacy film, located between the first adhesive layer and the third adhesive layer.

7. The display panel according to claim 1, wherein a thickness of the first shading layer is greater than a thickness of the shading part.

8. The display panel according to claim 1, wherein a thickness of the first shading layer is 4-10 microns.

9. The display panel according to claim 1, wherein the composite functional layer further comprises:
   a fourth adhesive layer, located on a side of the color film layer away from the base substrate;
   wherein the display panel further comprises:
   a privacy film, located between the first adhesive layer and the fourth adhesive layer.

10. The display panel according to claim 1, wherein the display panel further comprises:
    a second shading layer, located between the first adhesive layer and the cover plate, wherein the second shading layer comprises an inner ring part and an outer ring part surrounding the inner ring part, an orthographic projection of the outer ring part on the array substrate covers the non-display area, and an orthographic projection of a sidewall of the through hole on a plane of the array substrate surrounds an orthographic projection of the inner ring part on the plane of the array substrate.

11. The display panel according to claim 10, wherein a material of the first shading layer comprises a shading photoresist material or ink; and a material of the second shading layer comprises a shading photoresist material or ink.

12. A display device, wherein the display device comprises the display panel according to claim 1.

13. A method for manufacturing a display panel, comprising:
    providing an array substrate to be perforated, wherein the array substrate to be perforated comprises a base substrate and a light-emitting layer, and the array substrate to be perforated further comprises an area to be perforated and a non-display area surrounding the area to be perforated;
    forming a composite functional layer to be perforated on a side of the light-emitting layer away from the base substrate, wherein the composite functional layer to be perforated comprises a first shading material layer;
    forming a through hole in the area to be perforated of the array substrate to be perforated, wherein the through-hole penetrates the array substrate and the composite functional layer, and an orthographic projection of the perforated first shading material layer on the array substrate is located in the non-display area of the array substrate;
    adhering a cover plate on a side of the composite functional layer away from the base substrate through a first adhesive layer,
    wherein the light-emitting layer comprises a plurality of light-emitting units, and the composite functional layer further comprises:
    a color film layer, comprising a plurality of color filter parts and a shading part located among the plurality of the color filter parts, wherein the plurality of the color filter parts and the plurality of the light-emitting units are arranged in one-to-one correspondence, and an orthographic projection of a color filter part on the base substrate at least partially overlaps with an orthographic projection of a corresponding light-emitting unit on the base substrate; and wherein, the shading part and the first shading layer are formed on a same structural layer of the array substrate, the shading part and the first shading layer are formed of a same material, and an orthographic projection of the color film layer on the base substrate surrounds at least part of an orthographic projection of the first shading layer on the array substrate.

14. The method for manufacturing the display panel according to claim 13, wherein the orthographic projection of the perforated first shading material layer on the array substrate overlaps with the non-display area of the array substrate.

15. The method for manufacturing the display panel according to claim 13, wherein the forming the composite functional layer to be perforated on the side of the light-emitting layer away from the base substrate to be perforated, comprises:
forming the first shading material layer on the side of the light-emitting layer away from the base substrate to be perforated by a photolithography process;
wherein, the first shading material layer comprises a first shading part and a second shading part surrounding the first shading part, an orthographic projection of the first shading part on the array substrate overlaps with the area to be perforated, and an orthographic projection of the second shading part on the array substrate surrounds the area to be perforated and is located in the non-display area of the array substrate;
forming a second adhesive layer on a side of the first shading layer away from the base substrate;
forming a polarizer on a side of the second adhesive layer away from the base substrate;
forming a third adhesive layer on a side of the polarizer away from the base substrate;
wherein the method for manufacturing the display panel further comprises:
forming a privacy film between the first adhesive layer and the third adhesive layer, after forming the through hole in the area to be perforated of the array substrate to be perforated.

16. The method for manufacturing the display panel according to claim 13, wherein the forming the composite functional layer to be perforated on the side of the light-emitting layer away from the base substrate comprises:
forming the first shading material layer on the side of the light-emitting layer away from the base substrate to be perforated by a photolithography process;
wherein the first shading material layer comprises a first shading part and a second shading part surrounding the first shading part, an orthographic projection of the first shading part on the array substrate overlaps with the area to be perforated, and an orthographic projection of the second shading part on the array substrate surrounds the area to be perforated and is located in the non-display area of the array substrate;
forming the color film layer on the side of the light-emitting layer away from the base substrate to be perforated.

17. The method for manufacturing the display panel according to claim 16, wherein the forming the composite functional layer to be perforated on the side of the light-emitting layer away from the base substrate, further comprises:
increasing a thickness of the first shading material layer by at least one coating process.

18. The method for manufacturing the display panel according to claim 13, wherein the forming the composite functional layer to be perforated on the side of the light-emitting layer away from the base substrate to be perforated, comprises:
forming the first shading material layer on the side of the light-emitting layer away from the base substrate to be perforated by a photolithography process, wherein an orthographic projection of the first shading material layer on the array substrate overlaps with the non-display area of the array substrate.

19. The method for manufacturing the display panel according to claim 13, further comprising:
forming a second shading layer on a side of the cover plate to be fitted with the first adhesive layer, wherein the second shading layer comprises an inner ring part and an outer ring part surrounding the inner ring part;
wherein, after the cover plate is fitted with the composite functional layer, an orthographic projection of the outer ring part on the array substrate covers the non-display area of the array substrate, and an orthographic projection of a sidewall of the through hole on a plane of the array substrate surrounds an orthographic projection of the inner ring part on the plane of the array substrate.

20. A display panel, wherein the display panel comprises:
an array substrate, comprising a base substrate and a light-emitting layer;
a composite functional layer, located on a side of the light-emitting layer away from the base substrate, wherein a through hole penetrating the composite functional layer and the array substrate is formed in the array substrate and the composite functional layer;
wherein, the array substrate comprises a non-display area surrounding the through hole, the composite functional layer comprises a first shading layer, and an orthographic projection of the first shading layer on the array substrate is located in the non-display area of the array substrate;
a first adhesive layer, located on a side of the composite functional layer away from the base substrate; and
a cover plate, located on a side of the first adhesive layer away from the base substrate,
wherein the composite functional layer further comprises:
a second adhesive layer, located on a side of the first shading layer away from the base substrate; and
a polarizer, located on a side of the second adhesive layer away from the base substrate.

* * * * *